United States Patent [19]

Sato et al.

[11] 4,392,054
[45] Jul. 5, 1983

[54] METHOD AND APPARATUS FOR COMPENSATING FOR ASTIGMATISM IN ELECTRON BEAM DEVICES

[75] Inventors: Takeshi Sato; Shunichi Suzaki, both of Akishima, Japan

[73] Assignee: Kabushiki Kaisha Nichidenshi Technics, Tokyo, Japan

[21] Appl. No.: 254,523

[22] Filed: Apr. 15, 1981

[30] Foreign Application Priority Data

Apr. 16, 1980 [JP] Japan .................................. 55-50119

[51] Int. Cl.³ .............................................. G21K 1/08
[52] U.S. Cl. .................................... 250/307; 250/310; 250/396 R
[58] Field of Search ................ 250/396, 310, 311, 307

[56] References Cited

U.S. PATENT DOCUMENTS

| | | | |
|---|---|---|---|
| 4,162,403 | 7/1979 | Baumgarten | 250/311 |
| 4,180,738 | 12/1979 | Smith et al. | 250/311 |
| 4,214,163 | 7/1980 | Namae et al. | 250/311 |
| 4,321,468 | 3/1982 | Kimura | 250/310 |

*Primary Examiner*—Bruce C. Anderson
*Attorney, Agent, or Firm*—Webb, Burden, Robinson & Webb

[57] ABSTRACT

In a scanning electron microscope, astigmatism in an electron lens system is compensated for by an XY type stigmator equipped with two quadrupole lenses and their manually controlled direct current supplies. During the operation of astigmatism compensation, the supplemental current components are added stepwise to the output currents of said direct current supplies in synchronism with beam scanning in the microscope, so that the scanning image displayed in the microscope is divided into areas where astigmatism compensation is different. The operator of the microscope may accord the most sharp divided area with the center area of the scanning image by adjusting said direct current supplies, so that the output values of the direct current supplies become oprimum for astigmatism compensation.

10 Claims, 22 Drawing Figures

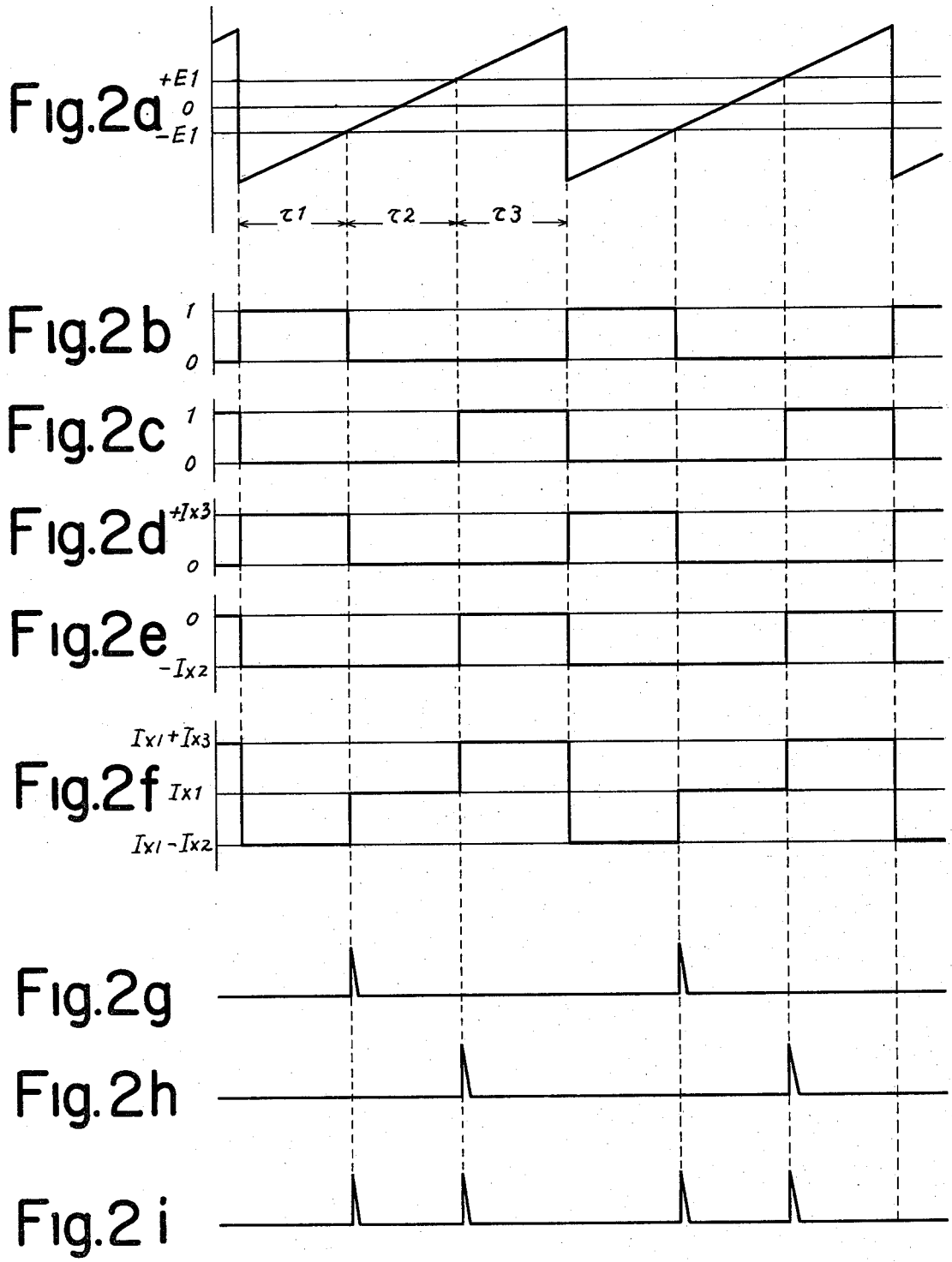

METHOD AND APPARATUS FOR COMPENSATING FOR ASTIGMATISM IN ELECTRON BEAM DEVICES

BACKGROUND OF THE INVENTION

This invention relates generally to electron beam devices and, more particularly, to a method and apparatus for facilitating the correction of axial astigmatism in electron probe forming systems.

The resolving power of the scanning image obtained by a scanning electron microscope, an electron probe microanalyzer, or other electron probe forming system, is essentially determined by the cross-section size of an electron probe irradiating a specimen surface. It must be as small as possible for observing a high resolving power image. Some of the factors determining the cross-section size of an electron probe are spherical and chromatic aberrations which are virtually uncontrollable as they are inherent in a given scanning electron microscope. Practical ways to form the smallest cross-section diameter of the electron probe in a given microscope comprise optimum focussing adjustment of an objective lens (or final stage condenser lens) and optimum compensation for astigmatism. The focussing adjustment technique has been studied enough, and automatic focussing devices create no particular problems. (See, for example, U.S. Pat. No. 3,937,959.)

The axial (on-axis) astigmatism is essentially caused by the nonuniformity of material of the lens magnetic pole piece, incompleteness of mechanical work and contamination of the aperture. To compensate axial astigmatism, generally a stigmator is employed. However, astigmatism compensation can only be effected by skilled operators and is difficult to accomplish for unskilled persons.

A method of compensating for astigmatism has been proposed in U.S. Pat. No. 4,162,403. According to the method disclosed therein, two quadrupole lenses in an XY type stigmator are supplied with first and second (horizontal and vertical) scanning signals, respectively, for modulation of the stigmator in synchronism with scanning of an electron beam over a specimen surface. Information signals generated from the specimen are applied as brightness modulation signals to a cathode-ray tube (CRT) that is scanned in synchronism with the electron beam scanning, thereby displaying an XY image map on the CRT. The X and Y bright line index markers are adjusted in conformity with the X and Y coordinates located at the center of the most sharp image area, so that the direct currents, the values of which correspond to the positions of the bright lines, are supplied to the quadrupole lenses.

With this method, the condition of astigmatism compensation is indicated as the X and Y coordinates on the image, allowing unskilled operators to effect optimum astigmatism compensation with relative ease. However, since it is necessary to select the coordinate position, or "spot", wherein the beam is correctly compensated, corrective operation is not possible or is difficult when an optimum corrected area is inside a large pattern with uniform brightness in the whole image. Accordingly, it is necessary to select the kind of specimen for astigmatism compensation.

It is, therefore, the main object of this invention to provide an improved method and apparatus for compensating for astigmatism in electron probe forming systems regardless of the kind of specimen to be observed.

Another object of this invention is to provide an improved method and apparatus for easily and accurately compensating for astigmatism in electron probe forming systems.

SUMMARY OF THE INVENTION

Briefly, according to this invention, an electron beam scanning device is provided with an XY type stigmator equipped with two quadrupole lenses and their manually controlled direct current supplies, and supplemental current supply for supplying stepwise changed currents to said two quadrupole lenses in synchronism with beam scanning, so that the scanning image displayed in a microscope is divided by several areas where astigmatism compensation is different from that of adjacent areas. The operator of the microscope may accord the most best corrected image area with the center area of the scanning image by adjusting total values of stepwise changed currents applied to said two quadrupole lenses. By so doing, the current values corresponding to said best corrected image area are used as current valves constantly applied to said two quadrupole lenses for astigmatism compensation.

BRIEF DESCRIPTION OF THE DRAWINGS

FIGS. 2(a) to 2(i) and 3(a) to 3(f) are schematic drawings for explaining the operation of the embodiment shown in FIG. 1.

DETAILED DESCRIPTION OF THE INVENTION

Figure 1:
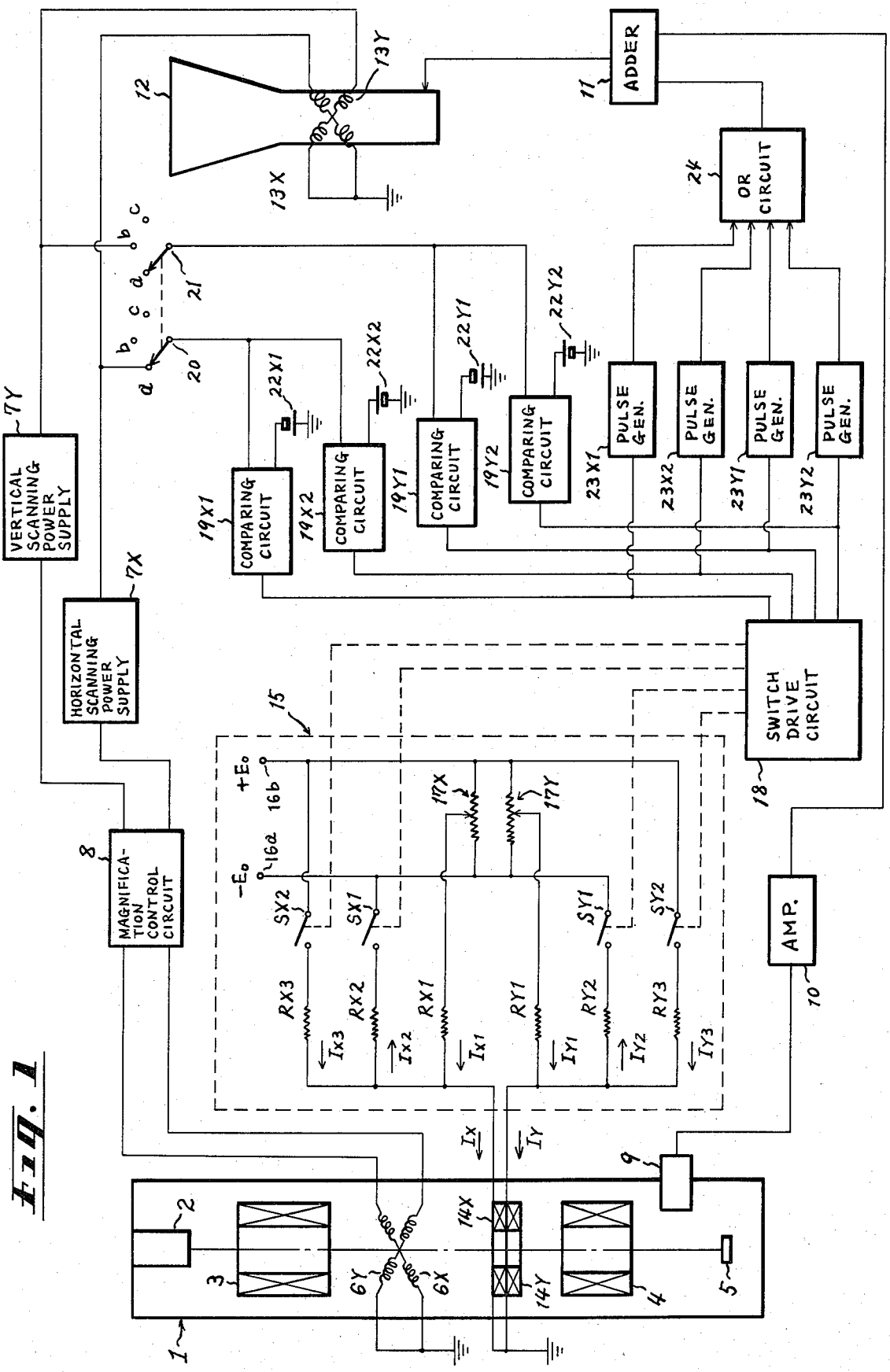
FIG. 1 is a schematic drawing showing one embodiment according to this invention.

FIG. 1 is a block diagram of an embodiment according to this invention. A scanning electron microscope has a column 1 having at its upper end an electron gun 2 which emits an electron beam that is coverged by a condenser lens 3 and an objective lens 4 thus irradiating a specimen 5 as an electron probe. Interposed between the condenser lens 3 and objective lens 4 are X and Y scanning deflection coils 6x, 6y that are composed of one or two stages and supplied with scanning (sawtooth shaped) signals from first and second (horizontal and vertical) scanning power supplies 7x, 7y via a magnification control circuit 8 for two-dimensionally scanning the electron beam over a surface area of the specimen 5. By the electron beam irradiation, backscattered or secondary electrons are emitted from the specimen 5 and detected by a detector 9 which supplies brightness modulation signals to the CRT 12 via an amplifier 10 and an adder 11.

A CRT 12 has deflection coils 13x, 13y supplied with scanning signals from the first and second (horizontal and vertical) scanning power supplies 7x, 7y for frame scanning in synchronism with the electron beam scanning over the specimen, so that there will be a brightness-modulation image displayed on the screen of the CRT 12.

In a practical scanning microscope, quadrupole lenses 14x, 14y of an XY type stigmator are assembled with the objective lens 4 and have magnetic pole pieces (or electrodes) of the quadrupole lenses angularly spaced 45 degrees from each other. A stigmator power supply 15 for the quadrupole lenses comprises a terminal 16a supplied with a d.c. voltage of −Eo, a terminal 16b supplied with a d.c. voltage of +Eo. Variable resistors 17x, 17y are connected between the terminals 16a, 16b. Resistors Rx1 and Ry1 are connected to sliders of the variable resistors for supplying the quadrupole lenses with compensation currents Ix1 and Iy1. Resistors Rx2 and Rx3 are connected in common to the resistor Rx1. Resistors Ry2 and Ry3 are connected in common to the resistor Ry1. A switch Sx1 is connected between the resistor Rx2 and the terminal 16a. A switch Sx2 is connected between the resistor Rx3 and the terminal 16b. A switch Sy1 is connected between the resistor Ry2 and the terminal 16a and a switch Sy2 connected between the resistor Ry3 and the terminal 16b.

The quadrupole lens 14x is supplied with currents Ix=Ix1−Ix2, or Ix1, or Ix1+Ix3, and the quadrupole lens 14y is supplied with currents Iy=Iy1−Iy2, Iy1, or Iy1+Iy3. The currents Ix1, Iy1 are variable by adjusting the variable resistors 17x, 17y. The switches Sx1, Sx2, Sy1 and Sy2 are controlled by signals supplied from a switch drive circuit 18.

Comparing circuits 19x1, 19x2 are supplied via a switch 20 with the horizontal scanning signal from the horizontal scanning power supply 7x, and comparing circuits 19y1, 19y2 are supplied via a switch 21 with the vertical scanning signal from the vertical scanning power supply 7y. The comparing circuits 19x1, 19x2, 19y1 and 19y2 compare the scanning signals with predetermined reference voltages −E1, +E1, −E2 and +E2 supplied from reference power supplies 22x1, 22x2, 22y1 and 22y2, respectively. When the scanning signals are in conformity with the reference voltages, the output signals are generated (or changed) and applied to the switch drive circuit 18.

Indicated at FIG. 2(a) is an output of the horizontal scanning power supply 7x, −E1, +E1 designating the output voltages from the reference power supplies 22x1, 22x2, respectively. Indicated at FIG. 2(b) is an output signal of the comparing circuit 19x1, which will become "0" when the horizontal scanning signal is greater than the reference voltage −E1. Indicated at FIG. 2(c) is an output signal of the comparing circuit 19x2, which will become "1" when the horizontal scanning signal is greater than the reference voltage +E1. Indicated at FIG. 2(d) is a signal from the switch drive circuit 18 for turning the switch Sx1 on during an interval of τ1 (which is equal to approximately one-third of a period of the horizontal scanning signal), and at FIG. 2(e), is a signal for turning the switch Sx2 on during an interval of τ3. The switches Sx1, Sx2 remain turned off during an interval τ2 between the intervals τ1, τ3. As a result, quadrupole lens 14x is supplied, as illustrated at FIG. 2(f), with a current of Ix1−Ix2 during the interval τ1, with a current of Ix1 during the interval of τ2, and with a current of Ix1+Ix3 during the interval of τ3, so that the quadrupole lens 14x is switched in three d.c. conditions in synchronism with the horizontal scanning operation.

The switches 20, 21 each has contacts 'a', 'b' and 'c' and are interlocked together for switching operation. The contact 'a' of the switch 20 is connected to the horizontal scanning power supply 7x, but the other contacts 'b', 'c' thereof remain unconnected. The contacts 'b' of the switch 21 is connected to the vertical scanning power supply 7y, the other contacts 'a', 'c' being unconnected. When the switches 20, 21 are connected to the contact 'a' as shown, only the horizontal scanning signal from the horizontal scanning power supply 7x is supplied to the comparing circuits 19x1, 19x2, and no vertical scanning signal is supplied to the comparing circuits 19y1, 19y2. Therefore, only the quadrupole lens 14x is supplied with the stepwise currents as illustrated at FIG. 2(f). While FIG. 2 shows waveforms of the signals which are related to the horizontal scanning, signals related to the vertical scanning have similar waveforms such that the quadrupole lens 14y is supplied with stepwise currents of Iy1−Iy2, Iy1, Iy1+Iy3 that are similar to those indicated at FIG. 2(f) when the switches 20, 21 are connected to contact 'b'.

Figure 3A:
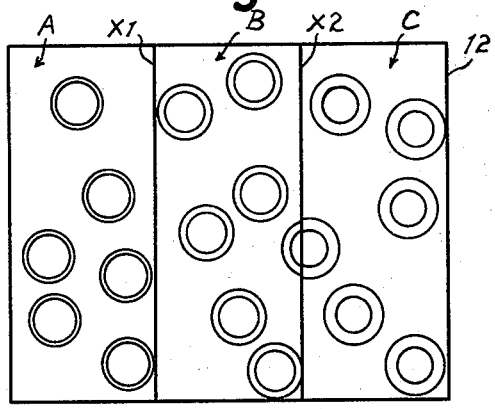
Figure 3B:
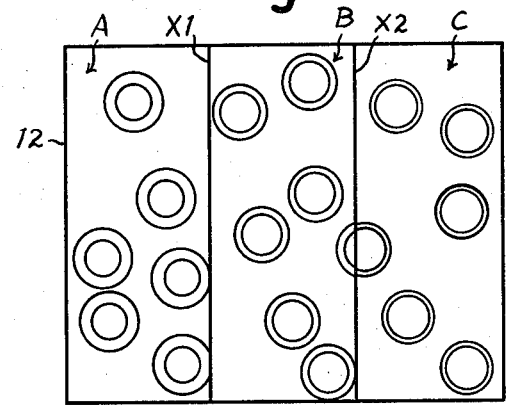
Figure 3C:
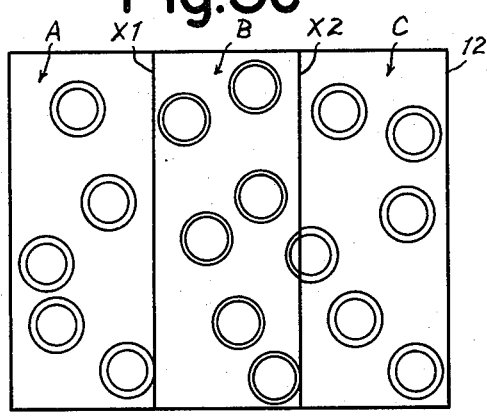
Figure 3D:
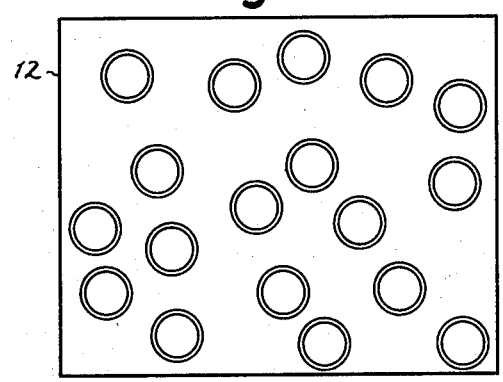
Figure 3E:
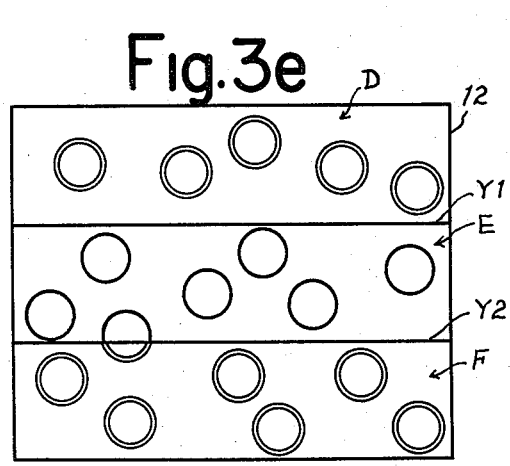

The output signals from the comparing circuits 19x1, 19x2, 19y1 and 19y2 are also applied to the pulse generators 23x1, 23x2, 23y1 and 23y2 which may comprise differentiation circuits, for example. The pulse generator 23x1 generates a pulse signal of a narrow width as shown at FIG. 2(g) upon fall of the signal (d), and the pulse generator 23x2 generates a pulse signal of a narrow width as shown at FIG. 2(h) upon rise of the signal (c). Both of the pulse signals are combined together as indicated at FIG. 2(i) in an OR circuit 24 and are applied to the adder 11. The pulse signals are added therein to video signals from the detector 9, and the composite signals are supplied to a brightness modulation grid or cathode of the CRT 12. Thus, as shown at FIGS. 3(a), (b), and (c), first and second bright lines X1, X2 appear at positions corresponding to the edge of the intervals τ1 and τ1+τ2. An area A leftward of the first bright line X1 is indicative of the compensation effect (condition) of the current Ix1−Ix2 to the quadrupole lens 14x, an area B between the bright lines X1, X2 is indicative of the compensation effect of the current Ix1 to the lens 14x, and an area C rightward of the second bright line X2 is indicative of the compensation effect of the current Ix1+Ix3 to the lens 14x. The pulse generators 23y1, 23y2 function in the same way as the pulse generators 23x1, 23x2 to produce pulse signals similar to those at FIG. 2(g) and FIG. 2(h) in synchronism with the vertical scanning operation, such pulse signals being combined together in the OR circuit 24 into a signal which is similar to that indicated at FIG. 2(i) and which is applied to the CRT 12 via the adder 11. As a consequence, the horizontal bright lines Y1, Y2 appear as shown at FIG. 3(e), dividing the screen into three areas D, E, and F. The area D indicates the supply of the current Iy1−Iy2 to the quadropole lens 14y, the area E indicates the supply of the current Iy1 to the lens 14y, and the area F indicates the supply of the current Iy1+Iy3 to the lens 14y.

In operation, the electron beam is scanned over the specimen 5 to produce information which is detected by the detector 9, which generates signals that are supplied to the CRT 12 to display a specimen image, the focussing of the electron beam being carried out by adjusting the intensity of the objective lens 4. When the switches 20, 21 are connected to the contact 'a', the horizontal scanning signal is sent to the comparing circuit 19x1, 19x2 for turning the switches Sx1, Sx2 on and off to supply the quadrupole lens 14x in the stigmator with the three stepwise currents Ix1−Ix2, Ix1, and Ix1+Ix3 as indicated at FIG. 2(f). At the same time, the pulse generators 23x1, 23x2 produce the pulse signals indicated at FIG. 2(g) and FIG. 2(h) which are combined together, added to the video signal, and applied to the CRT 12, whereupon an image appears on the screen, the image being divided by the lines X1, X2 into three areas as shown at FIGS. 3(a), 3(b) and 3(c). The areas A, B, and C are differently corrected since the quadrupole lens 14x is energized sequentially in different intensities. At FIG. 3(a), the area A is most sharp (best-corrected). The areas B and C are out of focus and away from optimum compensation. Conversely, the area C is most sharp as shown at FIG. 3(b). When the most sharp image is obtained in the end area A or C, the variable resistor 17x is adjusted until the most sharp area will become the central area B as shown at FIG. 3(c). Then, the switches 20, 21 are turned off by connecting to the contact 'c', whereupon an image at FIG. 3(d) appears over the screen which is corrected in the same degree as the area B at FIG. 3(c).

Figure 3F:
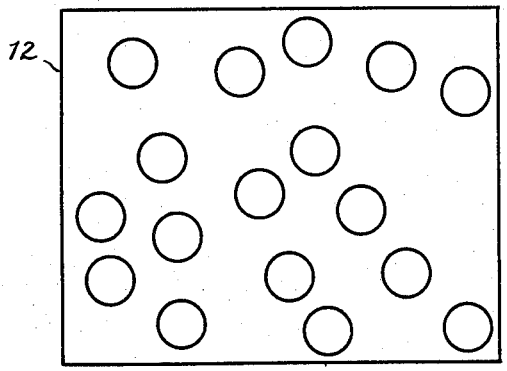

The switches 20, 21 are next connected to the contact 'b' to switch to the vertical scanning operation. An image as shown at FIG. 3(e) now appears, and the variable resistor 17y is adjusted to cause the central area E to be most sharp. After the compensation process has been completed, the switches 20, 21 are shifted to the contact 'c' to block the supply of the scanning signals to the comparing circuits 19x1, 19x2, 19y1 and 19y2, whereupon a most sharp image will appear as shown at FIG. 3(f), the astigmatism of which is completely compensated for in the directions of X and Y.

In the astigmatism compensation method described above, the divided areas A, B, C or D, E, F are compared with each other for the amount of astigmatism compensation of the image, and adjustment is made to cause the central areas B or E to be most sharp. Therefore, unskilled operators can effect astigmatism compensation with ease. Further, since the operator sees the sharpness of the "areas" which are relatively wide instead of searching for a focussed "spot" as is conventional, no difficulty arises out of sharpness of a relatively large pattern of an image being created and hence no limitation is imposed on specimens to be observed. In addition, astigmatism compensation is possible at a magnification of fifty thousand times or higher.

Figure 4:
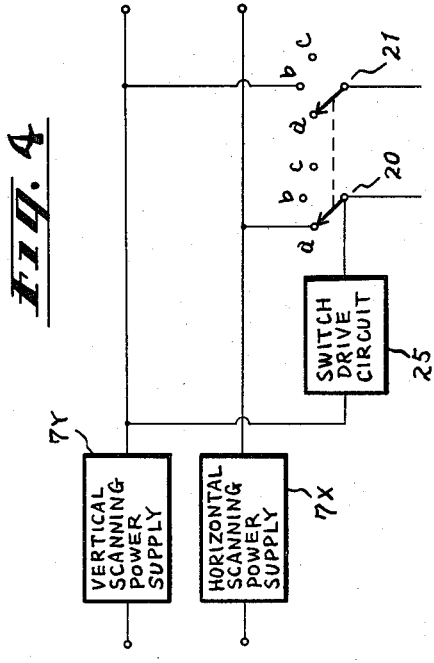
FIG. 4 is a partially schematic drawing of another embodiment according to this invention.
Figure 5:
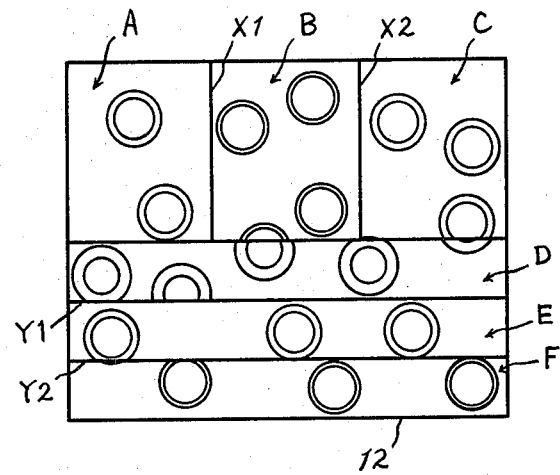
FIG. 5 is a schematic drawing for explaining the operation of the embodiment shown in FIG. 4.

Modifications and variations of this invention are possible in the light of the above description. For example, the image may be divided into five areas although division into three areas has been described. While compensations in the directions X and Y have been described as being effected separately, both the bright lines X1, X2 and Y1, Y2 may be displayed during one frame scanning in the CRT 12. FIG. 4 shows an essential part of a circuit arrangement for such modification, the other circuit elements being the same as those shown in FIG. 1. A switch drive circuit 25 automatically actuates the switches 20, 21 in synchronism with the vertical scanning signal from the vertical scanning power supply 7y. With this arrangement, the switches 20, 21 remain connected to the contact 'a' until the vertical scanning operation reaches the middle point thereof to supply only the comparing circuits 19x1, 19x2 with the horizontal scanning signal, and then the switches 20, 21 are shifted to the contact 'b' after the scanning has progressed past the middle point to supply only the comparing circuits 19y1, 19y2 with the vertical scanning signal, so that the screen displays in an upper half thereof an image indicative of the amount of astigmatism compensation in the direction of X, and in a lower half an image indicative of the amount of astigmatism compensation in the direction of Y, as shown in FIG. 5. Therefore, astigmatism can be fully corrected by independently or simultaneously adjusting the variable resistors 17x, 17y until the areas B and E show the sharpest images.

Figure 6:
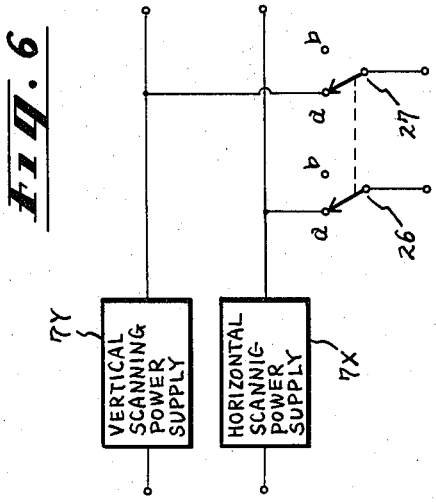
FIG. 6 is a partially schematic drawing of another embodiment according to this invention.
Figure 7A:
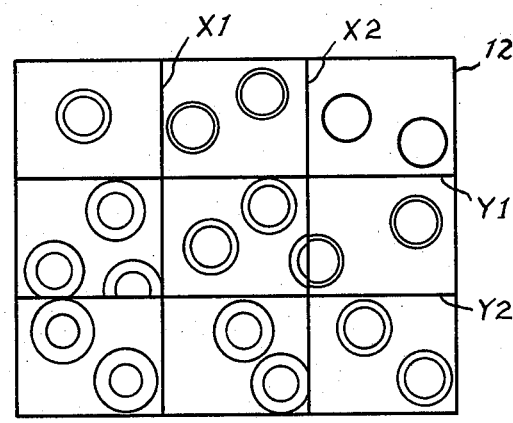
FIGS. 7(a) and 7(b) are schematic drawings for explaining the operation of the embodiment shown in FIG. 6.
Figure 7B:
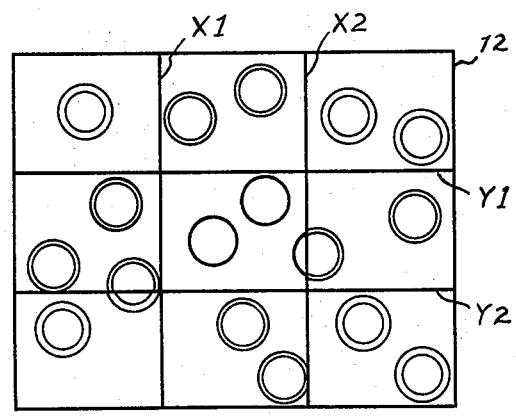

FIG. 6 shows an essential part of still another embodiment according to this invention. In this embodiment, the interlocked switches 26, 27 are incorporated instead of the switches 20, 21 in the embodiment of FIG. 1. When the switches 26, 27 are both turned on (contact 'a'), the horizontal and vertical scanning signals are supplied simultaneously to the comparing circuits 19x1, 19x2 and 19y1, 19y2, allowing an image as illustrated in FIG. 7 to be displayed on the screen. Nine areas divided by the lines X1, X2 and Y1, Y2 show the images corresponding to the amounts of astigmatism compensation in the directions X and Y. The area in which astigmatism compensation is optimized in the directions X and Y is that area which is best-corrected. The upper right-hand area is most sharp in FIG. 7(a). Astigmatism compensation is achieved by adjusting the variable resistors 17x, 17y until the central region becomes most sharp as illustrated in FIG. 7(b).

Figure 8:
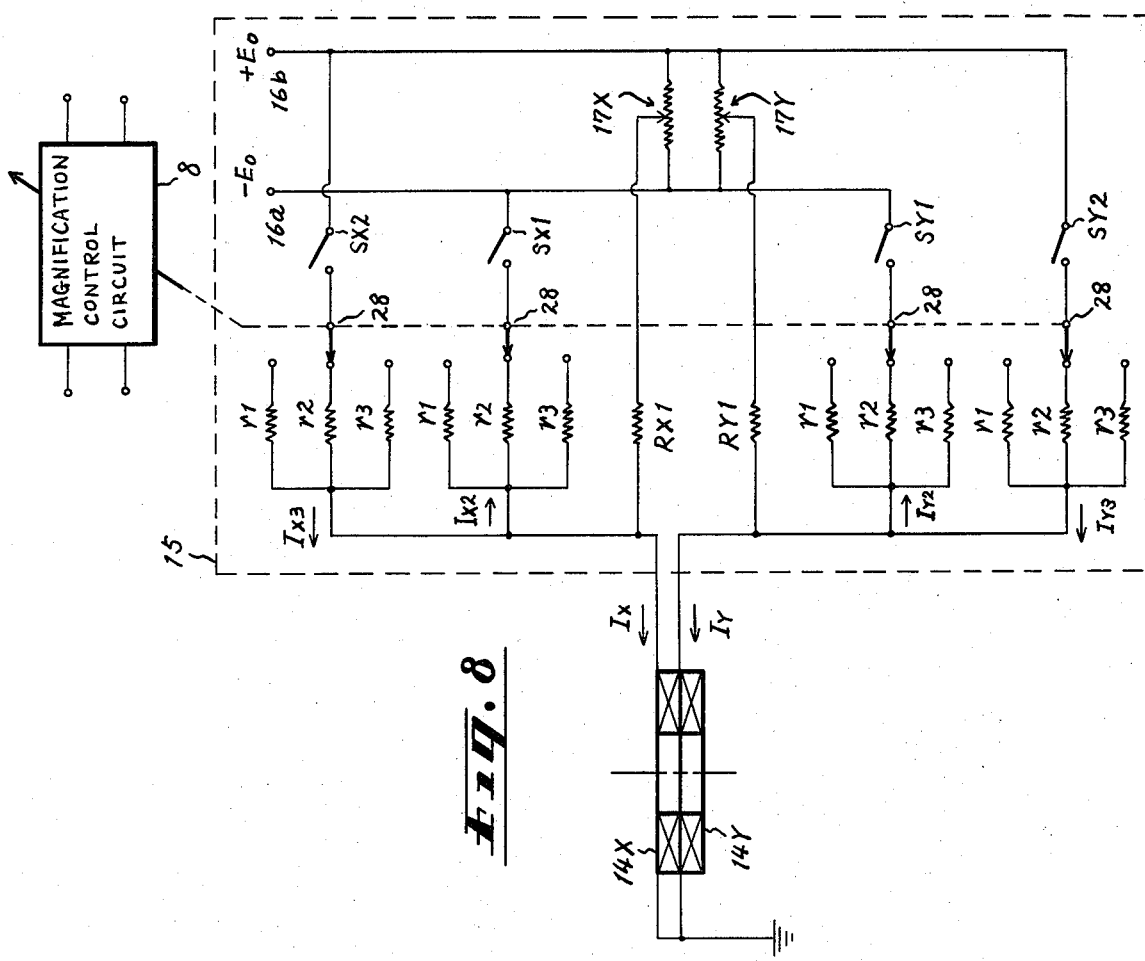
FIG. 8 is a partially schematic drawing of still another embodiment according to this invention.

FIG. 8 shows the essential part of another embodiment which is slightly modified from the embodiment of FIG. 1. In this embodiment, the sets of resistors r1, r2, r3 and interlocked changeover switches 28 are used instead of the resistors Rx2, Rx3, Ry2, Ry3 in the embodiment of FIG. 1. And supplemental current components Ix2, Ix3, Iy2, Iy3, which are added to manually adjusted currents components Ix1, Iy1, are varied by controlling the interlocked changeover switches 28, so that the change width of the stepwise currents Ix, Iy are varied. In order to achieve easy and precise astigmatism compensation operation, the first compensation operation is carried out under the condition that the change width of the stepwise currents Ix, Iy is maintained at the largest value and comparatively low image magnification, whereas further repeated operation is carried out under the condition that the change width of the stepwise currents Ix, Iy is smaller than that of first operation and comparatively high image magnification. Accordingly, it may be preferable to interlock the switches 28 and magnification control circuit 8.

Having thus defined the invention with the detail and particularity required by the Patent Laws, what is desired to be protected by Letters Patent is set forth in the following claims.

We claim:

1. A method for compensating astigmatism in an electron beam device comprising means for generating an electron beam, means including a lens system for focussing the electron beam on a specimen, means for deflecting the beam to cause it to scan over the specimen and means for detecting a signal generated by the interaction of the beam and the specimen surface, an image display means in synchronism with said scanning deflecting system to which the detected signal is applied, and an XY type stigmator equipped with two quadrupole lenses positioned in said lens system for compensating astigmatism, said method comprising:

(a) a step for supplying periodically stepwise changed currents to at least one of said two quadrupole lenses in synchronism with said scanning deflecting means so that different areas on the image of said display means are differently corrected for astigmastism, (b) a step for visually identifying the area on the image of the said displaying means that is best corrected for astigmatism, and (c) a step for constantly applying direct currents corresponding to those applied for the image area best corrected for astigmatism in the preceding step to said two quadrupole lenses.

2. A method for compensating astigmatism in an electron beam device comprising means for generating an electron beam, means including a lens system for focussing the electron beam on a specimen, means for deflecting the beam to cause it to scan over the specimen and means for detecting a signal generated by the interaction of the beam and the specimen surface, an image display means in synchronism with said scanning deflecting system to which the detected signal is applied, and an XY type stigmator equipped with two quadrupole lenses positioned in said lens system for compensating astigmatism, said method comprising:

(a) a step for supplying periodically stepwise changed currents to at least one of said two quadrupole lenses in synchronism with said scanning deflecting means so that different areas on the image of said display means are differently corrected for astigmatism, (b) a step for simultaneously shifting the total values of stepwise changed currents so that the area best corrected for astigmatism is located at the center of said display means, and (c) a step for constantly applying direct currents corresponding to those applied to the area at the center of the display means in the preceding step to said two quadrupole lenses.

3. An electron beam device comprising:
(a) a lens system for focussing the electron beam on a specimen;
(b) a scanning means equipped with first and second deflecting coils and first and second scanning power supplies for scanning the electron beam in a two dimensional raster over the specimen,
(c) means for detecting a signal generated by interaction of the beam and specimen surface,
(d) an image display means synchronized with said scanning means and supplied with the signal detected from the specimen as a brightness modulation signal for displaying the scanning image of the specimen,
(e) an XY type stigmator equipped with two quadrupole lenses for compensating astigmatism in said focussing lens system,
being characterized by
(f) a means for automatically stepwise changing the values of currents applied to said two quadrupole lenses,
(g) a means for controlling the changing means (f) in synchronism with said first scanning power supply and/or said second scanning power supply to provide at least three steps per scan in at least one direction,
(h) a means controllable by an operator visually observing the area of best correction for astigmatism upon the image display for simultaneously shifting the total values of the stepwise changed currents applied to said two quadrupole lenses so that the area best corrected for astigmatism is displayed on the screen of the image display means, and
(i) means for constantly applying the direct currents corresponding to those applied for the best corrected image area on the image display means to said two quadrupole lenses.

4. An electron beam device comprising:
(a) a lens system for focussing the electron beam on a specimen,
(b) a scanning means equipped with first and second deflecting coils and first and second scanning power supplies for scanning the electron beam in a two dimensional raster over the specimen,
(c) means for detecting a signal generated by interaction of the beam and specimen surface,
(d) an image display means synchronized with said scanning means and supplied with the signal detected from the specimen as a brightness modulation signal for displaying the scanning image of the specimen,
(e) an XY type stigmator equipped with two quadrupole lenses and manually and independently adjustable d.c. power supplied for compensating astigmatism in said focussing lens system,
being characterized by
(f) a means controllable by an operator visually observing the area of best correction for astigmatism upon the image display for automatically changing direct currents supplied to said two quadrupole lenses by periodically adding at least two supplemental current components, and
(g) a means for controlling the changing means in synchronism with said first scanning power supply and/or said second scanning power supply.

5. An electron beam device according to claim 4, in which said control means (g) controls the changing means (f) so that each stepwise change of the currents applied to the two quadrupole lenses is of the same polarity.

6. An electron beam device according to claim 4, in which said control means (g) controls the changing means (f) so that the stepwise changes of the currents applied to said two quadrupole lenses are repeatedly carried out during one sweep of the output signal of one of the scanning power supplies.

7. An electron beam device according to claim 4, in which said changing means (f) generates negative, zero and positive supplemental current components added to the output currents of said d.c. power supplies.

8. An electron beam device according to claim 4, further comprising means for controlling magnification and in which said changing means (f) changes the step magnitude in the stepwise currents according to the condition of said magnification control means.

9. An electron beam device comprising:
(a) a lens system for focussing the electron beam on a specimen,
(b) a scanning means equipped with first and second deflecting coils and their first and second scanning power supplies for scanning the electron beam in a two dimensional raster over the specimen,
(c) means for detecting a signal generated by interaction of the beam and specimen surface,
(d) an image display means being synchronized with said scanning means and supplied with a signal detected from the specimen as a brightness modulation signal for displaying the scanning image of the specimen, (e) an XY type stigmator equipped with two quadrupole lenses for compensating astigmatism in said focussing lens system, being characterized by (f) a means controllable by an operator visually observing the area of best correction for astigmatism upon the image display for automatically stepwise changing the values of currents applied to said two quadrupole lenses, (g) a control means for controlling the changing means (f) in synchronism with said horizontal scanning power supply and/or said vertical scanning power supply to provide at least three steps per scan in at least one direction, (h) a signal generating means for generating brightness modulation signals to the image display means (d) in synchronism with said control means (g) so that lines are displayed on the screen of said image display means between areas of different astigmatism correction, (i) an adjusting means for simultaneously shifting the total values of the stepwise changed currents applied to said two quadrupole lenses so that the image area best corrected for astigmatism is displayed on the screen of the image display means, and (j) a means for constantly applying the direct currents corresponding to those applied for the best corrected image area on the image display means to said two quadrupole lenses.

10. An electron beam device comprising:

(a) a lens system for focussing the electron beam on a specimen, (b) a scanning means equipped with first and second deflecting coils and their first and second scanning power supplies for scanning the electron beam in a two dimensional raster over the specimen, (c) means for detecting a signal generated by interaction of the beam and specimen surface, (d) an image display means being synchronized with said scanning means and supplied with a signal detected from the specimen as a brightness modulation signal for displaying the scanning image of the specimen, (e) an XY type stigmator equipped with two quadrupole lenses and manually and independently adjustable d.c. power supplies for compensating astigmatism in said focussing lens system, being characterized by (f) a means controllable by an operator visually observing the area of best correction for astigmatism upon the image display for automatically changing direct currents supplied to said two quadrupole lenses by periodically adding at least two supplemental current components, (g) a means for controlling the changing means in synchronism with said first scanning power supply and/or said second scanning power supply, and (h) a signal generating means for generating brightness modulation signals to the image display means in synchronism with said control means so that lines are displayed on the screen of said image display means between areas of different astigmatism correction.

* * * * *